United States Patent
Kim et al.

(10) Patent No.: US 11,606,076 B2
(45) Date of Patent: Mar. 14, 2023

(54) AIR-GAP TYPE FILM BULK ACOUSTIC RESONATOR

(71) Applicant: WISOL CO., LTD., Gyeonggi-do (KR)

(72) Inventors: Byung Hun Kim, Gyeonggi-do (KR); Jong Hyeon Park, Gyeonggi-do (KR); Yong Hun Ko, Gyeonggi-do (KR); Hyoung Woo Kim, Gyeonggi-do (KR)

(73) Assignee: WISOL CO., LTD., Gyeonggi-do (KR)

( * ) Notice: Subject to any disclaimer, the term of this patent is extended or adjusted under 35 U.S.C. 154(b) by 359 days.

(21) Appl. No.: 16/990,050

(22) Filed: Aug. 11, 2020

(65) Prior Publication Data
US 2021/0058055 A1    Feb. 25, 2021

(30) Foreign Application Priority Data
Aug. 19, 2019   (KR) .................. 10-2019-0101222

(51) Int. Cl.
H03H 9/02    (2006.01)
H03H 9/17    (2006.01)

(52) U.S. Cl.
CPC ........ H03H 9/02118 (2013.01); H03H 9/173 (2013.01)

(58) Field of Classification Search
CPC .......................... H03H 9/02118; H03H 9/173
See application file for complete search history.

(56) References Cited

U.S. PATENT DOCUMENTS

| | | | | |
|---|---|---|---|---|
| 2014/0176261 A1* | 6/2014 | Burak | ...................... | H03H 9/54 |
| | | | | 333/187 |
| 2014/0361664 A1* | 12/2014 | Taniguchi | .......... | H03H 9/02102 |
| | | | | 310/346 |
| 2015/0318837 A1* | 11/2015 | Zou | .................... | H03H 9/02086 |
| | | | | 333/187 |
| 2015/0326200 A1* | 11/2015 | Grannen | ............ | H03H 9/02102 |
| | | | | 310/346 |
| 2015/0349747 A1 | 12/2015 | Burak et al. | | |
| 2016/0308509 A1* | 10/2016 | Burak | .................... | H03H 9/132 |
| 2018/0062608 A1* | 3/2018 | Lee | ........................ | H01L 41/047 |
| 2018/0183406 A1* | 6/2018 | Patil | ....................... | H03H 9/173 |

FOREIGN PATENT DOCUMENTS

KR   10-2004-0102390 A    12/2004
KR   10-2019-0034838 A    4/2019

OTHER PUBLICATIONS

Office Action from corresponding Korean Patent Application No. 10-2019-0101222, dated Feb. 26, 2021.
Office Action from corresponding Korean Patent Application No. 10-2019-0101222, dated Jun. 30, 2021.

\* cited by examiner

*Primary Examiner* — Bryan P Gordon
(74) *Attorney, Agent, or Firm* — Harness, Dickey & Pierce, P.L.C.

(57) ABSTRACT

Disclosed is an air-gap type film bulk acoustic resonator (FBAR) including a substrate including an air-gap portion with a top surface in which a substrate cavity is formed, a lower electrode formed above the substrate while surrounding the air-gap portion, a piezoelectric layer formed above the lower electrode, and an upper electrode formed above the piezoelectric layer corresponding to a virtual area formed according to a vertical projection of the air-gap portion. Here, the piezoelectric layer includes a void portion having a piezoelectric cavity between the lower electrode and the upper electrode, and the void portion is formed below an edge portion corresponding to an end part of the upper electrode.

7 Claims, 8 Drawing Sheets

FIG. 8

AIR-GAP TYPE FILM BULK ACOUSTIC RESONATOR

CROSS-REFERENCE TO RELATED APPLICATION

This application claims priority to and the benefit of Korean Patent Application No. 2019-0101222, filed on Aug. 19, 2019, the disclosure of which is incorporated herein by reference in its entirety.

FIELD

The present invention relates to a resonator used for communication in a radio frequency band, and more particularly, to an air-gap type film bulk acoustic resonator (FBAR).

BACKGROUND

Wireless mobile communication technology requires a variety of radio frequency (RF) components capable of efficiently transmitting information within a limited frequency band. Particularly, among RF components, a filter is one of essential components used in mobile communication technology and enables high-quality communication by selecting a signal needed by a user among a plurality of frequency bands or filtering a signal to be transmitted.

Currently, a dielectric filter and a surface acoustic wave (SAW) filter are used most as an RF filter for wireless communication. The dielectric filter has advantages such as a high dielectric constant, a low insertion loss, stability at a high temperature, high vibration resistance, and high shock resistance. However, the dielectric filter has limitations in miniaturization and implementing a monolithic microwave integrated circuit (MMIC) which are recent trends of technology development. Also, the SAW filter has a small size in comparison to the dielectric filter, easily processes a signal, has a simple circuit, and is manufactured using a semiconductor process so as to facilitate mass production. Also, the SAW filter has an advantage of transmitting and receiving high-grade information due to higher side rejection within a passband in comparison to the dielectric filter. However, since an SAW filter process includes an exposure process using ultraviolet (UV), there is a disadvantage in which a line width of an interdigital transducer (IDT) has a limitation of about 0.5 μm. Accordingly, there is a problem in which it is impossible to cover an ultrahigh frequency band of 5 GHz or more using the SAW filter. Basically, there is a difficulty in forming an MMIC structure and a single chip on a semiconductor substrate.

In order to overcome such limitations and problems, a film bulk acoustic resonator (FBAR) filter integrated with other active devices on an existing semiconductor (Si or GaAs) substrate to completely implement a frequency control circuit as an MMIC is provided.

The FBAR is a thin film device which is low-cost, small-sized, and features high quality coefficient so as to be applicable to a wireless communication device, a military-use radar in a variety of frequency bands of 900 MHz to 10 GHz. Also, the FBAR is reduced in size as one-several hundredth of the dielectric filter and a lumped constant (LC) filter and has a very smaller insertion loss than the SAW filter. Accordingly, it is apparent that the FBAR is most adequate device for an MMIC which requires high stability and a high quality coefficient.

An FBAR filter is formed by depositing zinc oxide (ZnO), aluminum nitride (AlN), or the like which is a piezoelectric-dielectric material on silicon (Si) or gallium arsenide (GaAs) which is a semiconductor substrate using an RF sputtering method and causes resonation due to a piezoelectric property. That is, the FBAR generates resonance by depositing a piezoelectric film between both electrodes and causing a bulk acoustic wave.

A variety of forms of FBAR structures have been studied until now. In the case of a membrane type FBAR, a silicon oxide film ($SiO_2$) is deposited on a substrate and a membrane layer is formed using a cavity formed through isotropic etching on an opposite side of the substrate. Also, a lower electrode is formed above the silicon oxide film, a piezoelectric layer is formed by depositing a piezoelectric material above the lower electrode using an RF magnetron sputtering, and an upper electrode is formed above the piezoelectric layer.

The above membrane type FBAR has an advantage of less dielectric loss and power loss due to the cavity. However, the membrane type FBAR has problems in which an area occupied by a device is large due to a directivity of the silicon substrate and a yield is decreased by damages due to low structural stability in a follow-up packaging process. Accordingly, recently, in order to reduce a loss caused by the membrane and to simplify a device manufacturing process, an air-gap type FBAR and a Bragg reflector type FBAR have appeared.

The Bragg reflector type FBAR has a structure in which a reflection layer is formed by depositing materials having a high elastic impedance difference on every other layer on a substrate and a lower electrode, a piezoelectric layer, and an upper electrode are sequentially deposited. Here, elastic wave energy which has passed through the piezoelectric layer is not transferred toward the substrate and all reflected by the reflection layer so as to generate efficient resonation. Although the Bragg reflector type FBAR is structurally firm and has no stress caused by bending, it is difficult to form four or more reflection layers having a precise thickness for total reflection and large amounts of time and cost are necessary for manufacturing.

Meanwhile, in an existing air-gap type FBAR having a structure in which a substrate and a resonance portion are isolated using an air gap instead of a reflection layer, a sacrificial layer is implemented by performing isotropic etching on a surface of a silicon substrate and is surface-polished through chemical-mechanical polishing, an insulation layer, a lower electrode, a piezoelectric layer, and an upper electrode are sequentially deposited, and an air gap is formed by removing the sacrificial layer through a via hole so as to implement an FBAR.

Until now, a piezoelectric layer itself which is grown in a different direction not a Z-axis direction is used as it is depending on an electrode gradient in a part of an edge area of the lower electrode. As a problem caused thereby, an acoustic wave is generated in a lateral direction in addition to an acoustic wave component in a perpendicular direction which is a desired thickness direction.

Accordingly, in the case of a general existing bulk acoustic wave (BAW) structure, a frame structure is used to prevent energy from being released in a lateral direction. Even when the frame structure is optimized, there is a limitation in reducing energy released in the lateral direction.

RELATED ART DOCUMENT

Patent Document

Patent Document 1: Korean Patent Publication No. 10-2004-0102390 (published on Dec. 8, 2004)

SUMMARY

The present invention is directed to providing an air-gap type film bulk acoustic resonator (FBAR) capable of minimizing energy escaping from the FBAR through a side surface as well as improving a quality factor of resonator.

According to an aspect of the present invention, there is provided an air-gap type FBAR including a substrate including an air-gap portion with a top surface in which a substrate cavity is formed, a lower electrode formed above the substrate while surrounding the air-gap portion, a piezoelectric layer formed above the lower electrode, and an upper electrode formed above the piezoelectric layer corresponding to a virtual area formed according to a vertical projection of the air-gap portion. Here, the piezoelectric layer includes a void portion having a piezoelectric cavity between the lower electrode and the upper electrode, and the void portion is formed below an edge portion corresponding to an end part of the upper electrode.

The void portion may be a first void portion including a first piezoelectric cavity in which an opened top surface is formed to partially expose a bottom of the edge portion and a closed bottom surface is formed not to expose a top of the lower electrode.

In the first void portion, a first one side virtual surface perpendicularly extending from one side boundary wall forming the first piezoelectric cavity may meet a lower inner area of the edge portion. Also, a first other side virtual surface perpendicularly extending from another side boundary wall forming the first piezoelectric cavity may meet an upper inner area of the substrate cavity.

An end surface of the edge portion may be spaced at a certain distance or more apart from the first other side virtual surface so that a top of the first piezoelectric cavity may be partially opened.

The edge portion may be an electrode structure having a relatively greater electrode thickness in comparison to other electrode structures forming the upper electrode.

The piezoelectric layer may further include a second void portion having a second piezoelectric cavity formed to be spaced at a certain distance apart from the first void portion.

In the second piezoelectric cavity, a closed bottom surface may be formed not to expose a top of the lower electrode and an opened top surface may be formed to open an entirety of a top thereof.

In the second void portion, a second one side virtual surface perpendicularly extending from one side boundary wall forming the second piezoelectric cavity may meet an upper inner area of the substrate cavity. Also, a second other side virtual surface perpendicularly extending from another side boundary wall forming the second piezoelectric cavity may coincide with one side boundary wall of the air-gap portion.

A height of the first void portion or the second void portion may be smaller than or equal to half a thickness of the piezoelectric layer.

A lateral width of the first void portion or the second void portion may be greater than or equal to a quarter of a wavelength of energy discharged through the piezoelectric layer.

In the piezoelectric layer, a piezoelectric area located below the first void portion or the second void portion may have a relatively high acoustic impedance in comparison to piezoelectric areas at other positions.

The void portion may be a third void portion including a third piezoelectric cavity in which a closed top surface is formed not to expose a bottom of upper electrode and an opened bottom surface is formed to expose a top of the lower electrode.

In the third void portion, a first one side virtual surface perpendicularly extending from one side boundary wall forming the third piezoelectric cavity may coincide with an end of the edge portion. Also, a first other side virtual surface perpendicularly extending from another side boundary wall forming the third piezoelectric cavity may meet an upper inner area of the substrate cavity.

The piezoelectric layer may further include a fourth void portion having a fourth piezoelectric cavity formed to be spaced at a certain distance apart from the third void portion.

In the fourth piezoelectric cavity, a closed top surface may be formed not to expose a bottom of the upper electrode and an opened bottom surface may be formed to expose a top of the lower electrode.

A height of the third void portion or the fourth void portion may be smaller than or equal to half a thickness of the piezoelectric layer.

A lateral width of the third void portion or the fourth void portion may be greater than or equal to a quarter of a wavelength of energy discharged through the piezoelectric layer.

In the piezoelectric layer, a piezoelectric area located above the third void portion or the fourth void portion may have a relatively high acoustic impedance in comparison to piezoelectric areas at other positions.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION

Hereinafter, exemplary embodiments of the present invention will be described in detail with reference to the attached drawings.

The embodiments of the present invention are provided to more completely explain the present invention to one of ordinary skill in the art. The embodiments of the present invention may be changed in a variety of forms, and the scope of the present invention is not limited to the following embodiments. The embodiments are provided to make the present disclosure more substantial and complete and to completely transfer the concept of the present invention to those skilled in the art The terms are used herein to explain particular embodiments but not intended to limit the present invention. As used herein, singular expressions, unless clearly defined otherwise in context, include plural expressions. Also, as used herein, the term "and/or" includes any and all combinations or one of a plurality of associated listed items. Also, hereinafter, the embodiments of the present invention will be described with reference drawings which schematically illustrate the embodiments of the present invention.

Figure 1:
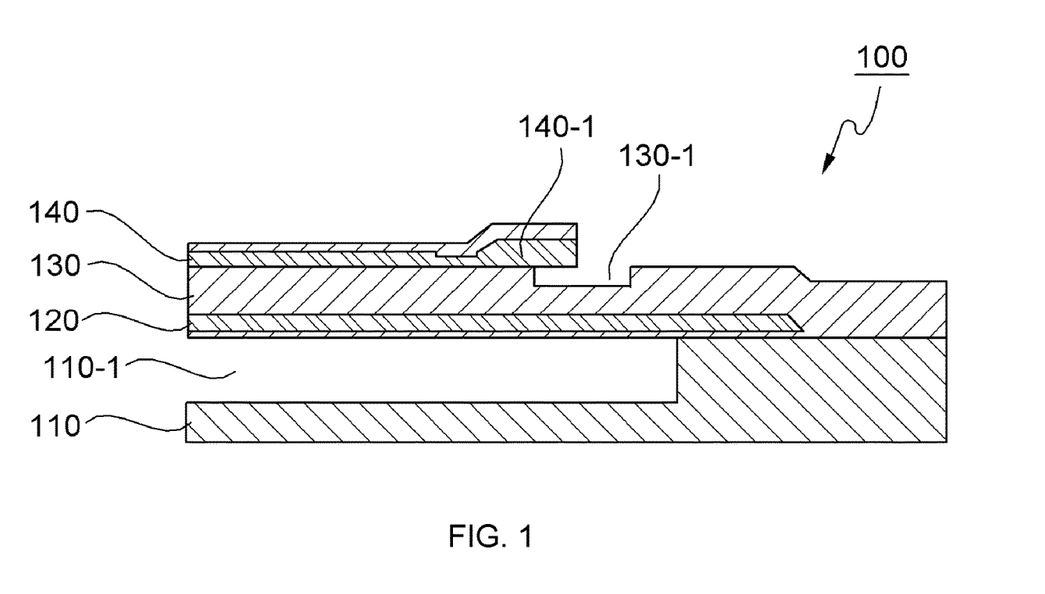
FIG. 1 is a cross-sectional view of an air-gap type film bulk acoustic resonator (FBAR) according to a first embodiment of the present invention.

FIG. 1 is a cross-sectional view of an air-gap type film bulk acoustic resonator (FBAR) 100 according to a first embodiment of the present invention.

Referring to FIG. 1, the air-gap type FBAR 100 according to the first embodiment includes a substrate 110, an air-gap portion 110-1, a lower electrode 120, a piezoelectric layer 130, and an upper electrode 140. When a signal is applied between the lower electrode 120 and the upper electrode 140, the air-gap type FBAR 100 resonates with respect to a frequency of natural oscillation according to a thickness of the piezoelectric layer 130 while part of electrical energy input and transferred between the two electrodes is converted into mechanical energy according to a piezoelectric effect and is converted again into electrical energy.

The substrate 110 is a semiconductor substrate, and a general silicon wafer may be used. Preferably, a high resistivity silicon substrate (HRS) may be used. An insulation layer (not shown) may be formed on a top surface of the substrate 100. As the insulation layer, a thermal oxidation layer, which is easily growable on the substrate 100, may be employed or an oxide film or a nitride film formed using a general deposition process such as chemical vapor deposition and the like may be selectively employed.

The air-gap portion 110-1 is formed by forming a substrate cavity in the substrate 110, forming an insulation layer on the substrate cavity, depositing a sacrificial layer above the insulation layer, planarizing the sacrificial layer above the insulation layer through etching, and removing the sacrificial layer. Here, the sacrificial layer is formed using a material such as polysilicon, tetraethyl orthosilicate, phosphosilicate glass (PSG), and the like, which has high surface roughness, and it is easy to form or remove the sacrificial layer using the same. As an example, a sacrificial layer may employ polysilicon which has high surface roughness. It is easy to form or remove the sacrificial layer using polysilicon. Particularly, the sacrificial layer may be removed using dry etching in a follow-up process.

The lower electrode 120 is formed above the air-gap portion 110-1 where the sacrificial layer exists in the substrate cavity. The lower electrode 120 is formed by depositing a certain material above the substrate 110 and patterning the deposited material. A material used for the lower electrode 120 includes a general conductive material such as a metal, and preferably, may include one of aluminum (Al), tungsten (W), gold (Au), platinum (Pt), nickel (Ni), titanium (Ti), chrome (Cr), palladium (Pd), ruthenium (Ru), rhenium (Re), and molybdenum (Mo). A thickness of the lower electrode 120 may be 10 to 1,000 nm.

The piezoelectric layer 130 is formed above the lower electrode 120. The piezoelectric layer 130 may be formed by depositing a piezoelectric material above the lower electrode 120 and patterning the deposited piezoelectric material. As a general piezoelectric material, there is aluminum nitride (AlN) or zinc oxide (ZnO). A deposition method includes a radio frequency magnetron sputtering method, an evaporation method, and the like. A thickness of the piezoelectric electrode 130 may be 5 to 500 nm.

The piezoelectric layer 130 may include a void portion between the lower electrode 120 and the upper electrode 140 in which a piezoelectric cavity is formed. Here, the void portion may be formed below an edge portion corresponding to an end part of the upper electrode 140. The void portion will be described below in detail.

The upper electrode 140 is formed above the piezoelectric layer 130. The upper electrode 140 may be formed above the piezoelectric layer 130 corresponding to a virtual area according to vertical projection of the air-gap portion 110-1. When a void portion is formed in the piezoelectric layer 130 and a sacrificial layer is formed therein, the upper electrode 140 may be formed above a part of the sacrificial layer. The upper electrode 140 may be formed by depositing a metal film for an upper electrode in a certain area above the piezoelectric layer 130 and patterning the deposited metal film. The upper electrode 140 may be formed using the same material, same deposition method, and same patterning method as those of the lower electrode 120. A thickness of the upper electrode 140 may be 5 to 1000 nm.

An edge portion 140-1 is formed at an end part of one side of the upper electrode 140. The edge portion 140-1 may be an electrode structure having a relatively greater electrode thickness in comparison to other electrode structures included in the upper electrode 140. The edge portion 140-1 corresponds to an edge frame of the upper electrode 140 and performs a function of blocking energy escaping through a side surface part.

Meanwhile, a pad layer may be formed to be applied to parts of the above-described lower electrode 120, piezoelectric layer 130, and upper electrode 140. The pad layer functions as a cover for protecting the lower electrode 120, the piezoelectric layer 130, and the upper electrode 140.

Detailed features of the void portion formed in the piezoelectric layer 130 will be described as follows.

Figure 2:
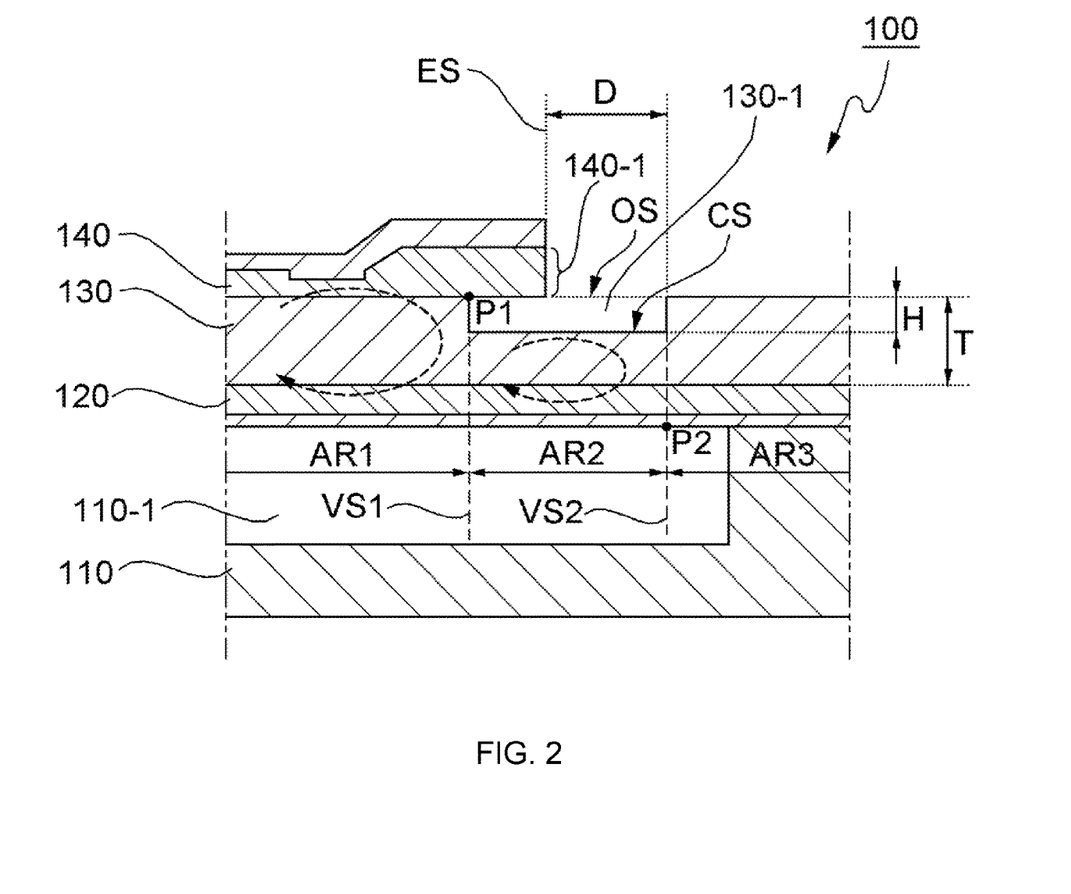
FIG. 2 is an enlarged cross-sectional view illustrating a main part of the air-gap type FBAR according to the first embodiment shown in FIG. 1.

FIG. 2 is an enlarged cross-sectional view illustrating a main part of the air-gap type FBAR 100 according to the first embodiment shown in FIG. 1.

Referring to FIG. 2, the piezoelectric layer 130 may include an air space, that is, a first void portion 130-1 having a first piezoelectric cavity between the lower electrode 120 and the upper electrode 140.

The first void portion 130-1 is formed by forming the first piezoelectric cavity by etching some areas on a top of the piezoelectric layer 130, depositing and planarizing a sacrificial layer above the first piezoelectric cavity, depositing the upper electrode 140 above the piezoelectric layer 130 including the sacrificial layer, and then removing the sacrificial layer. Here, the sacrificial layer is formed using a material such as polysilicon, tetraethyl orthosilicate, phosphosilicate glass (PSG), and the like, which has excellent surface roughness, and it is easy to form or remove the sacrificial layer using the same.

Here, the first void portion 130-1 may form the first piezoelectric cavity that is a partial air space through which a bottom of the upper electrode 140 is partially exposed and a top of the lower electrode 120 is not exposed. That is, the first void portion 130-1 may include the first piezoelectric cavity having an opened top surface OS formed to partially expose a bottom of the edge portion 140-1 and a closed bottom surface CS formed not to expose a top of the lower electrode 120.

In the first void portion 130-1, a first one side virtual surface VS1 perpendicularly extending from an one side boundary wall forming the first piezoelectric cavity may meet a lower inner area of the edge portion 140-1 and a point P1 at which the first one side virtual surface VS1 meets the lower inner area of the edge portion 140-1 may be located inside an end of the edge portion 140-1.

In the first void portion 130-1, a first other side virtual surface VS2 perpendicularly extending from another side boundary wall forming the first piezoelectric cavity may meet an upper inner area of the substrate cavity and a point P2 at which the first other side virtual surface VS2 meets the upper inner area of the substrate cavity may be located on an upper virtual surface of the substrate cavity included in the air-gap portion 110-1.

An end surface ES of the edge portion 140-1 may be spaced at a certain distance or more apart from the first other side virtual surface VS2 so that a top of the first piezoelectric cavity may be partially opened. The first void portion 130-1 is formed below the edge portion 140-1 corresponding to an end part of the upper electrode 140. Here, since the edge portion 140-1 does not surround an entirety of a top surface of the first piezoelectric cavity in the first void portion 130-1 but partially surround the first piezoelectric cavity (for example, only half the first piezoelectric cavity), the first void portion 130-1 may partially open the top of the first piezoelectric cavity. Here, a distance between the end surface ES of the edge portion 140-1 and the first other side virtual surface VS2, that is, a certain distance D may vary according to a deposition area of the first void portion 130-1 of the upper electrode 140.

A height H of the first void portion 130-1 may be smaller than or equal to half a thickness T of the piezoelectric layer 130. The first void portion 130-1 is formed so that a thickness varies in each area of the piezoelectric layer 130. That is, thicknesses of a first piezoelectric area AR1, a second piezoelectric area AR2, and a third piezoelectric area AR3 of the piezoelectric layer 130 may differ from each other. Particularly, the second area AR2 may have a thickness reduced as much as the height of the first void portion 130-1. The height H of the first void portion 130-1 is formed to be smaller than or equal to half the thickness T of the piezoelectric layer 130 so as to provide a minimum thickness which allows heat generated inside to be easily released.

Also, a lateral width of the first void portion 130-1 may be a quarter of a wavelength of energy discharged through the piezoelectric layer 130. When the energy wavelength is indicated as λ, the lateral width of the first void portion 130-1 may be a value of λ*(2N+1)/4 (here, N is an integer greater than or equal to 0).

Meanwhile, in the piezoelectric layer 130, a piezoelectric area located below the first void portion 130-1 has relatively high acoustic impedance in comparison to a piezoelectric area in a different location. Since the thicknesses of the first piezoelectric area AR1, the second piezoelectric area AR2, and the third piezoelectric area AR3 of the piezoelectric layer 130 differ from each other, acoustic impedance varies in each of the piezoelectric areas. That is, as the thickness of the piezoelectric layer 130 decreases, acoustic impedance increases. As the thickness increases, acoustic impedance decreases. Accordingly, when it is assumed that acoustic impedances with respect to the first piezoelectric area AR1, the second piezoelectric area AR2, and the third piezoelectric area AR3 of the piezoelectric layer 130 are referred to as a first acoustic impedance I1, a second acoustic impedance I2, and a third acoustic impedance I3, respectively, the second acoustic impedance I2 of the second piezoelectric area AR2, in which the first void portion 130-1 is located, has a relatively greater impedance value than that of the first acoustic impedance I1 or the third acoustic impedance I3. Also, when the acoustic impedances of the first piezoelectric area AR1 and the third piezoelectric area AR3 are compared to each other, the first acoustic impedance I1 has a greater impedance value than that of the third acoustic impedance I3. When a relationship thereof is expressed as an inequality sign, it may be seen that acoustic impedances are great in order of I3<I1<I2.

Differences in acoustic impedance caused by changes in thickness may prevent acoustic energy from being released by reflecting a pressure wave escaping from the piezoelectric layer 130 in a lateral direction. That is, due to a difference between the first acoustic impedance I1 of the first piezoelectric area AR1 and the second acoustic impedance I2 of the second piezoelectric area AR2, energy present in the first piezoelectric area AR1 may collide with a boundary of the second piezoelectric area AR2 and return to the first piezoelectric area AR1 so as to minimize the energy escaping from the first piezoelectric area AR1 to the second piezoelectric area AR2. Also, although some energy escapes from the first piezoelectric area AR1 to the second piezoelectric area AR2, due to a difference between the second acoustic impedance I2 of the second piezoelectric area AR2 and the third acoustic impedance I3 of the third piezoelectric area AR3, energy present in the second piezoelectric area AR2 may collide with a boundary of the third piezoelectric area AR3 and return to the second piezoelectric area AR2 so as to minimize the energy escaping from the second piezoelectric area AR2 to the third piezoelectric area AR3.

Figure 3:
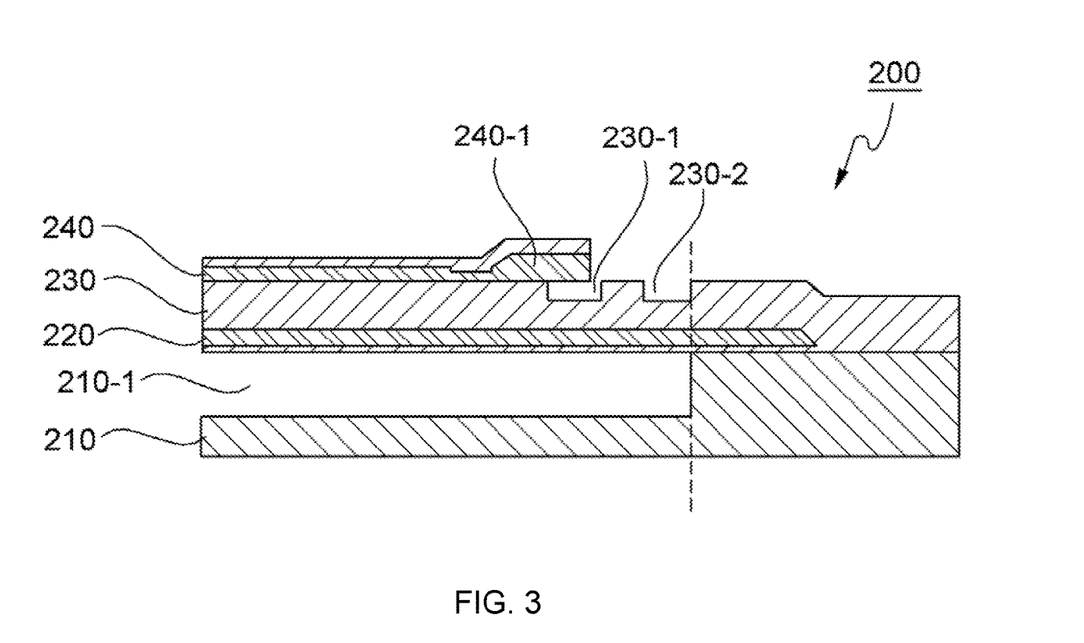
FIG. 3 is a cross-sectional view of an air-gap type FBAR according to a second embodiment of the present invention.

FIG. 3 is a cross-sectional view of an air-gap type FBAR 200 according to a second embodiment of the present invention.

Referring to FIG. 3, the air-gap type FBAR 200 according to the second embodiment includes a substrate 210, an air-gap portion 210-1, a lower electrode 220, a piezoelectric layer 230, and an upper electrode 240. When a signal is applied between the lower electrode 220 and the upper electrode 240 from the outside, the air-gap type FBAR 200 resonates at a frequency of natural oscillation according to a thickness of the piezoelectric layer 230.

Here, since features of the substrate 210, the air-gap portion 210-1, the lower electrode 220, and the upper electrode 240 are equal to those of the substrate 110, the air-gap portion 110-1, the lower electrode 120, and the upper electrode 140 which are described above with reference to FIG. 1, a detailed description thereof will be omitted. Hereinafter, the piezoelectric layer 230 will be mainly described.

The piezoelectric layer 230 is formed above the lower electrode 220. The piezoelectric layer 230 may be formed by depositing a piezoelectric material above the lower electrode 220 and patterning the deposited piezoelectric material. The piezoelectric layer 230 may include two void portions between the lower electrode 220 and the upper electrode 140, in which a piezoelectric cavity is formed. Here, the two void portions are referred to as a first void portion 230-1 and a second void portion 230-2.

Figure 4:
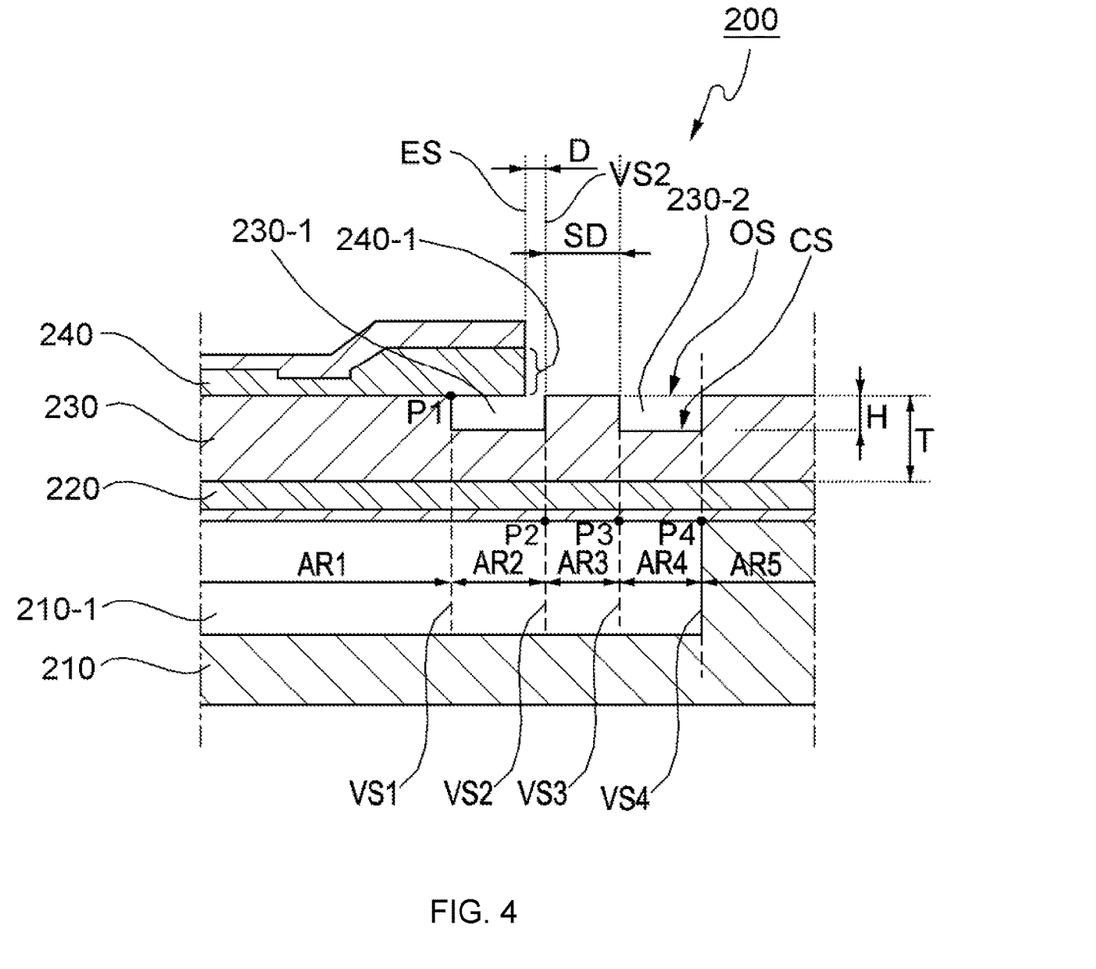
FIG. 4 is an enlarged cross-sectional view illustrating a main part of the air-gap type FBAR according to the second embodiment shown in FIG. 3.

FIG. 4 is an enlarged cross-sectional view illustrating a main part of the air-gap type FBAR 200 according to the second embodiment shown in FIG. 3.

Referring to FIG. 4, the piezoelectric layer 230 may include two air spaces, that is, the first void portion 230-1 having a first piezoelectric cavity and the second void portion 230-2 having a second piezoelectric cavity between the lower electrode 220 and the upper electrode 240.

The first void portion 230-1 is formed by forming the first piezoelectric cavity by etching some areas on a top of the piezoelectric layer 230, depositing and planarizing a sacrificial layer above the first piezoelectric cavity, depositing the upper electrode 240 above the piezoelectric layer 230 including the sacrificial layer, and then removing the sacrificial layer. Here, since a feature of the first void portion 230-1 is equal to that of the first void portion 130-1 shown in FIG. 2, a detailed description thereof will be omitted, and hereinafter, the second void portion 230-2 will be described in detail.

The second void portion 230-1 includes the second piezoelectric cavity formed to be spaced at a certain distance SD apart from the first void portion 230-1. The second piezoelectric cavity of the second void portion 230-2 may include a closed bottom surface CS not to expose a top of the lower electrode 220 and an opened top surface OS to expose an entirety of a top thereof.

Here, a second one side virtual surface VS3 perpendicularly extending from one side boundary wall forming the second piezoelectric cavity may meet an upper inner area of a substrate cavity forming the air-gap portion 210-1. A point P3 where the second one side virtual surface VS3 meets the upper inner area of the substrate cavity may be located on an upper virtual surface of the substrate cavity forming the air-gap portion 210-1.

Also, a second other side virtual surface VS4 perpendicularly extending from another side boundary wall forming the second piezoelectric cavity may coincide with the one side boundary wall of the air-gap portion 210-1. A point P4 where the second other side virtual surface VS4 meets the upper virtual surface of the substrate cavity may be located on the one side boundary wall of the air-gap portion 210-1.

A height H of the second void portion 230-2 may be smaller than or equal to half a thickness T of the piezoelectric layer 230 like the first void portion 130-1 shown in FIG. 2. The first void portion 230-1 and the second void portion 230-2 are formed in the piezoelectric layer 230 so that a thicknesses of the piezoelectric layer 230 varies in respective areas. That is, thicknesses of a first piezoelectric area AR1, a second piezoelectric area AR3, a third piezoelectric area AR3, a fourth piezoelectric area AR4, and a fifth piezoelectric area AR5 of the piezoelectric layer 230 may differ from each other. Particularly, the second piezoelectric area AR2 and the fourth piezoelectric area AR4 may have thicknesses reduced as much as of a height of the first void portion 230-1 or the second void portion 230-2. A height H of the first void portion 230-1 or the second void portion 230-2 is formed to be smaller than or equal to half the thickness T of the piezoelectric layer 230 so as to provide a minimum thickness which allows heat generated inside to be easily released.

Also, a lateral width of the first void portion 230-1 or the second void portion 230-2 may be a quarter of a wavelength of energy discharged through the piezoelectric layer 230. When the energy wavelength is indicated as $\lambda$, the lateral width of the first void portion 230-1 or the second void portion 230-2 may be a value of $\lambda*(2N+1)/4$ (here, N is an integer greater than or equal to 0).

Meanwhile, in the piezoelectric layer 230, a piezoelectric area located below the first void portion 230-1 or the second void portion 230-2 has relatively high acoustic impedance in comparison to a piezoelectric area in a different location. Since the thicknesses of the first piezoelectric area AR1, the second piezoelectric area AR2, the third piezoelectric area AR3, the fourth piezoelectric area AR4, and the fifth piezoelectric area AR5 of the piezoelectric layer 230 differ from each other, acoustic impedance varies in each of the piezoelectric areas.

When it is assumed that acoustic impedances with respect to the first piezoelectric area AR1, the second piezoelectric area AR2, the third piezoelectric area AR3, the fourth piezoelectric area AR4, and the fifth piezoelectric area AR5 of the piezoelectric layer 230 are referred to as a first acoustic impedance I1, a second acoustic impedance I2, a third acoustic impedance I3, a fourth acoustic impedance I4, and a fifth acoustic impedance I5, respectively, the second acoustic impedance I2 corresponding to the second piezoelectric area AR2 and the fourth acoustic impedance I4 corresponding to the fourth piezoelectric area AR4 have relatively greater impedance values than that of the first acoustic impedance I1, the third acoustic impedance I3, or the fifth acoustic impedance I5. Also, when the first acoustic impedance I1, the third acoustic impedance I3, and the fifth acoustic impedance I5 are compared with each other, the third acoustic impedance I3 has a relatively greater impedance value than that of the first acoustic impedance I1 or the fifth acoustic impedance I5, and the first acoustic impedance I1 has a relatively greater impedance value than that of the fifth acoustic impedance I5. When a relationship thereof is expressed as an inequality sign, it may be seen that acoustic impedances are great in order of I5<I1<I3<I2=I4.

Differences in acoustic impedance caused by changes in thickness of the piezoelectric layer 230 may prevent energy from escaping from the piezoelectric layer 230 in a lateral direction.

That is, due to a difference between the first acoustic impedance I1 of the first piezoelectric area AR1 and the second acoustic impedance I2 of the second piezoelectric area AR2, energy present in the first piezoelectric area AR1 may collide with a boundary of the second piezoelectric area AR2 and return to the first piezoelectric area AR1 so as to minimize the energy escaping from the first piezoelectric area AR1 to the second piezoelectric area AR2. Also, although some energy escapes from the first piezoelectric area AR1 to the second piezoelectric area AR2, due to a difference between the second acoustic impedance I2 of the second piezoelectric area AR2 and the third acoustic impedance I3 of the third piezoelectric area AR3, energy present in the second piezoelectric area AR2 may collide with a boundary of the third piezoelectric area AR3 and return to the second piezoelectric area AR2 so as to minimize the energy escaping from the second piezoelectric area AR2 to the third piezoelectric area AR3.

Also, due to a difference between the third acoustic impedance I3 of the third piezoelectric area AR3 and the fourth acoustic impedance I4 of the fourth piezoelectric area AR4, energy present in the third piezoelectric area AR3 may collide with a boundary of the fourth piezoelectric area AR4 and return to the third piezoelectric area AR3. Due to a difference between the fourth acoustic impedance I4 of the fourth piezoelectric area AR4 and the fifth acoustic impedance I5 of the fifth piezoelectric area AR5, energy present in the fourth piezoelectric area AR4 may collide with a boundary of the fifth piezoelectric area AR5 and return to the fourth piezoelectric area AR4 so as to minimize the energy escaping from the fourth piezoelectric area AR4 to the fifth piezoelectric area AR5.

Figure 5:
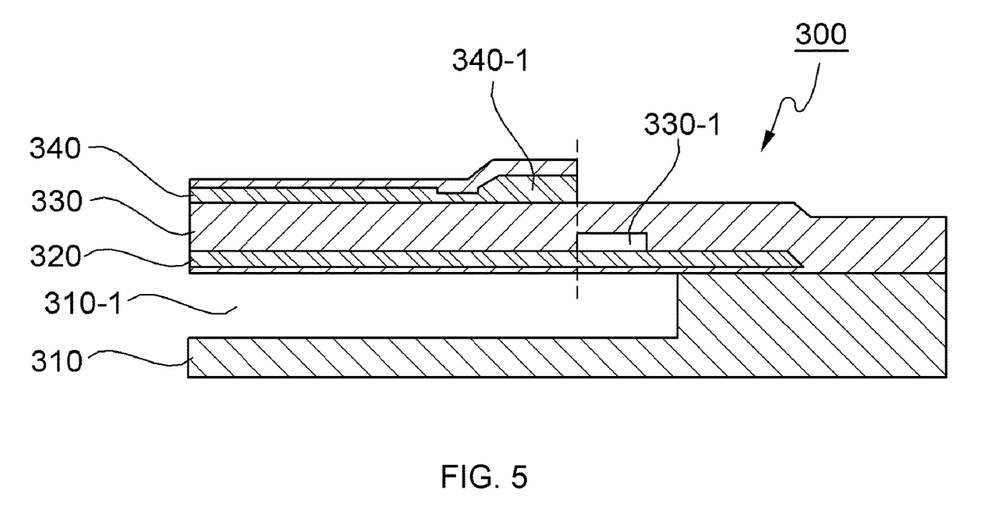
FIG. 5 is a cross-sectional view of an air-gap type FBAR according to a third embodiment of the present invention.

FIG. 5 is a cross-sectional view of an air-gap type FBAR 300 according to a third embodiment of the present invention.

Referring to FIG. 5, the air-gap type FBAR 300 according to the third embodiment includes a substrate 310, an air-gap portion 310-1, a lower electrode 320, a piezoelectric layer 330, and an upper electrode 340. When a signal is applied between the lower electrode 320 and the upper electrode 340 from the outside, the air-gap type FBAR 300 resonates at a frequency of natural oscillation according to a thickness of the piezoelectric layer 330.

Here, since features of the substrate 310, the air-gap portion 310-1, the lower electrode 320, and the upper electrode 340 are equal to those of the substrate 110, the air-gap portion 110-1, the lower electrode 120, and the upper electrode 140 which are described above with reference to FIG. 1, a detailed description thereof will be omitted. Hereinafter, the piezoelectric layer 330 will be mainly described.

The piezoelectric layer 330 is formed above the lower electrode 320. The piezoelectric layer 330 may be formed by depositing a piezoelectric material above the lower electrode 320 and patterning the deposited piezoelectric material. The piezoelectric layer 330 may include a void portion between the lower electrode 320 and the upper electrode 340, in which a piezoelectric cavity is formed. Here, the void portion will be referred to as a third void portion 330-1.

Figure 6:
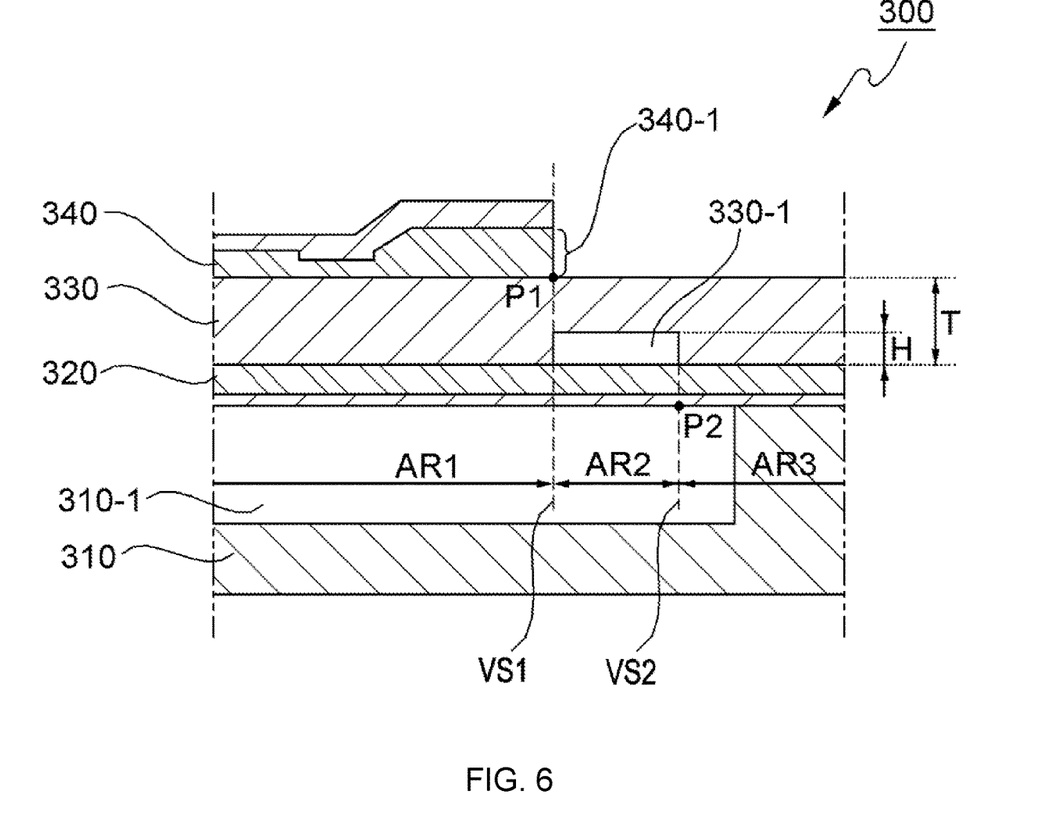
FIG. 6 is an enlarged cross-sectional view illustrating a main part of the air-gap type FBAR according to the third embodiment shown in FIG. 5.

FIG. 6 is an enlarged cross-sectional view illustrating a main part of the air-gap type FBAR 300 according to the third embodiment shown in FIG. 5.

Referring to FIG. 6, the piezoelectric layer 330 may include an air space, that is, the third void portion 330-1 having a third piezoelectric cavity between the lower electrode 320 and the upper electrode 340.

The third void portion 330-1 may be formed in a part of a bottom of the piezoelectric layer 330. The third void portion 330-1 may be formed by depositing a sacrificial layer corresponding to the third piezoelectric cavity above the lower electrode 320, depositing the piezoelectric layer 330 above the deposited sacrificial layer, and then removing the sacrificial layer of the third piezoelectric cavity.

Here, the third void portion 330-1 may form the third piezoelectric cavity that is a partial air space through which a top of the lower electrode 320 is partially exposed and a bottom of the upper electrode 340 is not exposed. That is, the third void portion 330-1 may include the third piezoelectric cavity which includes a closed top surface formed not to expose a bottom of the upper electrode 340 and an opened bottom surface formed to expose a top of the lower electrode 320.

In the third void portion 330-1, a first one side virtual surface VS1 perpendicularly extending from one side boundary wall forming the third piezoelectric cavity may coincide with an end surface of an edge portion 340-1 of the upper electrode 340. A point P1 where the first one side virtual surface VS1 meets the end surface of the edge portion 340-1 may be located on a boundary wall of the edge portion 340-1.

Also, in the third void portion 330-1, a first other side virtual surface VS2 perpendicularly extending from another side boundary wall forming the third piezoelectric cavity may meet an upper inner area of the substrate cavity and a point P2 at which the first other side virtual surface VS2 meets the upper inner area of the substrate cavity may be located on an upper virtual surface of the substrate cavity included in the air-gap portion 310-1.

A height H of the third void portion 330-1 may be smaller than or equal to half a thickness T of the piezoelectric layer 330. The third void portion 330-1 is formed so that a thickness varies in each area of the piezoelectric layer 330. That is, thicknesses of a first piezoelectric area AR1, a second piezoelectric area AR2, and a third piezoelectric area AR3 of the piezoelectric layer 330 may differ from each other. Particularly, the second area AR2 may have a thickness reduced as much as the height of the third void portion 330-1. The height H of the third void portion 330-1 is formed to be smaller than or equal to half the thickness T of the piezoelectric layer 330 so as to provide a minimum thickness which allows heat generated inside to be easily released.

Also, a lateral width of the third void portion 330-1 may be a quarter of a wavelength of energy discharged through the piezoelectric layer 330. When the energy wavelength is indicated as $\lambda$, the lateral width of the third void portion 330-1 may be a value of $\lambda*(2N+1)/4$ (here, N is an integer greater than or equal to 0).

Meanwhile, in the piezoelectric layer 330, a piezoelectric area located above the third void portion 330-1 has relatively high acoustic impedance in comparison to a piezoelectric area in a different location. Since the thicknesses of the first piezoelectric area AR1, the second piezoelectric area AR2, and the third piezoelectric area AR3 of the piezoelectric layer 330 differ from each other, acoustic impedance varies in each of areas. Accordingly, when it is assumed that acoustic impedances with respect to the first piezoelectric area AR1, the second piezoelectric area AR2, and the third piezoelectric area AR3 of the piezoelectric layer 330 are referred to as a first acoustic impedance I1, a second acoustic impedance I2, and a third acoustic impedance I3, respectively, the second acoustic impedance I2 of the second piezoelectric area AR2, in which the third void portion 330-1 is located, has a relatively greater impedance value than that of the first acoustic impedance I1 or the third acoustic impedance I3. Also, when the acoustic impedances of the first piezoelectric area AR1 and the third piezoelectric area AR3 are compared to each other, the first acoustic impedance I1 has a greater impedance value than that of the third acoustic impedance I3. When a relationship thereof is expressed as an inequality sign, acoustic impedances are great in order of I3<I1<I2. Differences in acoustic impedance caused by changes in thickness of the piezoelectric layer 330 may prevent energy from being released from the piezoelectric layer 330 in a lateral direction.

Figure 7:
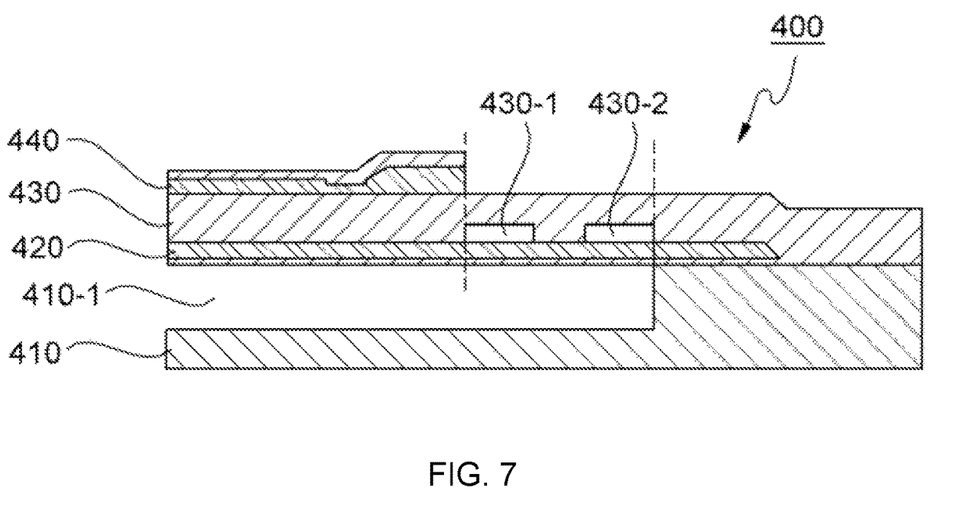
FIG. 7 is a cross-sectional view of an air-gap type FBAR according to a fourth embodiment of the present invention.

FIG. 7 is a cross-sectional view of an air-gap type FBAR 400 according to a fourth embodiment of the present invention.

Referring to FIG. 7, the air-gap type FBAR 400 according to the fourth embodiment includes a substrate 410, an air-gap portion 410-1, a lower electrode 420, a piezoelectric layer 430, and an upper electrode 440. When a signal is applied between the lower electrode 420 and the upper electrode 440 from the outside, the air-gap type FBAR 400 resonates at a frequency of natural oscillation according to a thickness of the piezoelectric layer 430.

Here, since features of the substrate 410, the air-gap portion 410-1, the lower electrode 420, and the upper electrode 440 are equal to those of the substrate 110, the air-gap portion 110-1, the lower electrode 120, and the upper electrode 140 which are described above with reference to FIG. 1, a detailed description thereof will be omitted. Hereinafter, the piezoelectric layer 430 will be mainly described.

The piezoelectric layer 430 is formed above the lower electrode 420. The piezoelectric layer 430 may be formed by depositing a piezoelectric material above the lower electrode 420 and patterning the deposited piezoelectric material. The piezoelectric layer 430 may include two void portions between the lower electrode 420 and the upper electrode 140, in which a piezoelectric cavity is formed. Here, the two void portions are referred to as a first void portion 430-1 and a second void portion 430-2.

Figure 8:
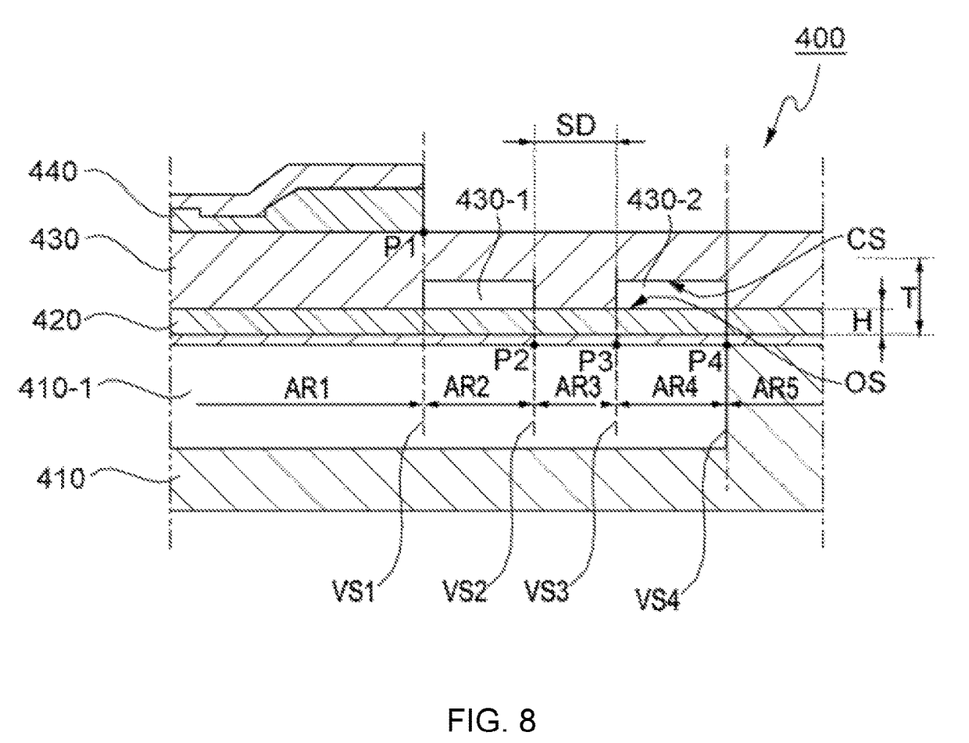
FIG. 8 is an enlarged cross-sectional view illustrating a main part of the air-gap type FBAR according to the fourth embodiment shown in FIG. 7.

FIG. 8 is an enlarged cross-sectional view illustrating a main part of the air-gap type FBAR 400 according to the fourth embodiment shown in FIG. 7.

Referring to FIG. 8, the piezoelectric layer 430 may include two air spaces, that is, the third void portion 430-1 having a third piezoelectric cavity and the fourth void portion 430-2 having a fourth piezoelectric cavity between the lower electrode 420 and the upper electrode 440.

The third void portion 430-1 may be formed in a part of a bottom of the piezoelectric layer 430. The third void portion 430-1 may be formed by depositing a sacrificial layer corresponding to the third piezoelectric cavity above the lower electrode 420, depositing the piezoelectric layer 430 above the deposited sacrificial layer, and then removing the sacrificial layer of the third piezoelectric cavity.

Here, since a feature of the third void portion 430-1 is equal to that of the third void portion 330-1 shown in FIG. 6, a detailed description thereof will be omitted, and hereinafter, the fourth void portion 430-2 will be described in detail.

The fourth void portion 430-2 includes the fourth piezoelectric cavity formed to be spaced at a certain distance SD apart from the third void portion 430-1. The fourth piezoelectric cavity of the fourth void portion 430-2 may include a closed top surface CS not to expose a bottom of the upper electrode 440 and an opened bottom surface OS to partially expose a top of the lower electrode 420.

Here, a second one side virtual surface VS3 perpendicularly extending from one side boundary wall forming the fourth piezoelectric cavity may meet an upper inner area of a substrate cavity forming the air-gap portion 410-1. A point P3 where the second one side virtual surface VS3 meets the upper inner area of the substrate cavity may be located on an upper virtual surface of the substrate cavity forming the air-gap portion 410-1.

Also, a second other side virtual surface VS4 perpendicularly extending from another side boundary wall forming the fourth piezoelectric cavity may coincide with the one side boundary wall of the air-gap portion 410-1. A point P4 where the second other side virtual surface VS4 meets the upper virtual surface of the substrate cavity may be located on the one side boundary wall of the air-gap portion 410-1.

A height H of the fourth void portion 430-2 may be smaller than or equal to half a thickness T of the piezoelectric layer 430 like the third void portion 330-1 shown in FIG. 6. The third void portion 430-1 and the fourth void portion 430-2 are formed in the piezoelectric layer 430 so that a thicknesses of the piezoelectric layer 430 varies in respective areas. That is, thicknesses of a first piezoelectric area AR1, a second piezoelectric area AR3, a third piezoelectric area AR3, a fourth piezoelectric area AR4, and a fifth piezoelectric area AR5 of the piezoelectric layer 430 may differ from each other. Particularly, the second piezoelectric area AR2 and the fourth piezoelectric area AR4 may have thicknesses reduced as much as of a height of the third void portion 430-1 or the fourth void portion 430-2. A height H of the third void portion 430-1 or the fourth void portion 430-2 is formed to be smaller than or equal to half the thickness T of the piezoelectric layer 430 so as to provide a minimum thickness which allows heat generated inside to be easily released.

Also, a lateral width of the third void portion 430-1 or the fourth void portion 430-2 may be a quarter of a wavelength of energy discharged through the piezoelectric layer 430. When the energy wavelength is indicated as $\lambda$, the lateral width of the third void portion 430-1 or the fourth void portion 430-2 may be a value of $\lambda*(2N+1)/4$ (here, N is an integer greater than or equal to 0).

Meanwhile, in the piezoelectric layer 430, a piezoelectric area located above the third void portion 430-1 or the fourth void portion 430-2 has relatively high acoustic impedance in comparison to a piezoelectric area in a different location. Since the thicknesses of the first piezoelectric area AR1, the second piezoelectric area AR2, the third piezoelectric area AR3, the fourth piezoelectric area AR4, and the fifth piezoelectric area AR5 of the piezoelectric layer 430 differ from each other, acoustic impedance varies in each of the areas.

When it is assumed that acoustic impedances with respect to the first piezoelectric area AR1, the second piezoelectric area AR2, the third piezoelectric area AR3, the fourth piezoelectric area AR4, and the fifth piezoelectric area AR5 of the piezoelectric layer 430 are referred to as a first acoustic impedance I1, a second acoustic impedance I2, a third acoustic impedance I3, a fourth acoustic impedance I4, and a fifth acoustic impedance I5, respectively, the second acoustic impedance I2 corresponding to the second piezoelectric area AR2 and the fourth acoustic impedance I4 corresponding to the fourth piezoelectric area AR4 have relatively greater impedance values than that of the first acoustic impedance I1, the third acoustic impedance I3, or the fifth acoustic impedance I5. Also, when the first acoustic impedance I1, the third acoustic impedance I3, and the fifth acoustic impedance I5 are compared with each other, the third acoustic impedance I3 has a relatively greater impedance value than that of the first acoustic impedance I1 or the fifth acoustic impedance I5, and the first acoustic impedance I1 has a relatively greater impedance value than that of the fifth acoustic impedance I5. When a relationship thereof is expressed as an inequality sign, it may be seen that acoustic impedances are great in order of $I5<I1<I3<I2=I4$. Differences in acoustic impedance caused by changes in thickness of the piezoelectric layer 430 may prevent energy from being released from the piezoelectric layer 430 in a lateral direction.

As described above, a piezoelectric layer includes at least one void portion so as to induce a pitch status of acoustic impedance and to minimize energy released through a side surface of the FBAR. Accordingly, since it is possible to increase quality factors and a void portion reduces an area of a thick edge portion 140-1 which comes into contact with a piezoelectric layer, it is possible to suppress spurious occurrence caused by the edge portion 140-1 and to compensate a decrease in $K^2_{eff}$ value.

According to the present invention, it is possible to increase quality factors by minimizing energy discharged through a side surface of an FBAR by inducing a pitch status of acoustic impedance using a piezoelectric cavity formed in a piezoelectric layer.

Also, it is possible to prevent a $K^2_{eff}$ value from being decreased due to an increase in a thickness of an edge portion of an upper electrode by forming a piezoelectric cavity in a piezoelectric layer.

Also, in the case of a communication filter using a resonator according to the present invention, quality factors are increased so that an insertion loss may be reduced and a skirt property may be improved.

The exemplary embodiments of the present invention have been described above. It should be understood by one of ordinary skill in the art that modifications may be made without departing from the essential features of the present invention. Therefore, the disclosed embodiments should be considered not in a limitative view but a descriptive view. The scope of the present invention will be shown in the claims not in the above description, and all differences within an equivalent range thereof should be construed as being included in the present invention.

What is claimed is:

1. An air-gap type film bulk acoustic resonator (FBAR) comprising:
    a substrate comprising an air-gap portion with a top surface in which a substrate cavity is formed;
    a lower electrode formed above the substrate while surrounding the air-gap portion;
    a piezoelectric layer formed above the lower electrode; and
    an upper electrode formed above the piezoelectric layer corresponding to a virtual area formed according to a vertical projection of the air-gap portion,
    wherein the piezoelectric layer comprises a third void portion having a third piezoelectric cavity between the lower electrode and the upper electrode, and a fourth void portion having a fourth piezoelectric cavity formed to be spaced at a certain distance apart from the third void portion, and
    wherein the third void portion is formed below an edge portion corresponding to an end part of the upper electrode.

2. The air-gap type FBAR of claim 1, wherein in the third piezoelectric cavity, a closed top surface is formed not to be in contact with a bottom of the upper electrode and an opened bottom surface is formed to be in contact with a top of the lower electrode.

3. The air-gap type FBAR of claim 2, wherein in the third void portion, a first one side virtual surface perpendicularly extending from one side boundary wall forming the third piezoelectric cavity coincides with an end of the edge portion, and
    wherein a first other side virtual surface perpendicularly extending from another side boundary wall forming the third piezoelectric cavity meets an upper inner area of the substrate cavity.

4. The air-gap type FBAR of claim 1, wherein in the fourth piezoelectric cavity, a closed top surface is formed not to be in contact with a bottom of the upper electrode and an opened bottom surface is formed to be in contact with a top of the lower electrode.

5. The air-gap type FBAR of claim 1, wherein a height of the third void portion or the fourth void portion is smaller than or equal to half a thickness of the piezoelectric layer.

6. The air-gap type FBAR of claim 1, wherein a lateral width of the third void portion or the fourth void portion is greater than or equal to a quarter of a wavelength of energy discharged through the piezoelectric layer.

7. The air-gap type FBAR of claim 1, wherein in the piezoelectric layer, a piezoelectric area located above the third void portion or the fourth void portion has a relatively high acoustic impedance in comparison to piezoelectric areas at other positions.

* * * * *